(12) United States Patent
Huwer et al.

(10) Patent No.: US 9,632,161 B2
(45) Date of Patent: Apr. 25, 2017

(54) METHOD AND MAGNETIC RESONANCE SYSTEM FOR TIME-DEPENDENT INTENSITY CORRECTION OF DIFFUSION-WEIGHTED MR IMAGES

(71) Applicants: Stefan Huwer, Erlangen (DE); David Andrew Porter, Poxdorf (DE)

(72) Inventors: Stefan Huwer, Erlangen (DE); David Andrew Porter, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 710 days.

(21) Appl. No.: 14/043,985

(22) Filed: Oct. 2, 2013

(65) Prior Publication Data

US 2014/0091790 A1 Apr. 3, 2014

(30) Foreign Application Priority Data

Oct. 2, 2012 (DE) ........................ 10 2012 217 997

(51) Int. Cl.
*G01V 3/00* (2006.01)
*G01R 33/56* (2006.01)
*G01R 33/563* (2006.01)
*G01R 33/565* (2006.01)

(52) U.S. Cl.
CPC ......... *G01R 33/56* (2013.01); *G01R 33/5659* (2013.01); *G01R 33/56341* (2013.01)

(58) Field of Classification Search
CPC .............. G01R 33/56; G01R 33/56341; G01R 33/5659
USPC ........................................................ 324/307
See application file for complete search history.

(56) References Cited

U.S. PATENT DOCUMENTS

| 5,488,297 | A | 1/1996 | Nakada |
| 5,560,360 | A | 10/1996 | Filler et al. |
| 6,445,184 | B1 | 9/2002 | Tanttu |
| 6,647,134 | B1 * | 11/2003 | McGee .............. G01R 33/5673 382/128 |

(Continued)

FOREIGN PATENT DOCUMENTS

DE 103 19 037 A1 11/2004

OTHER PUBLICATIONS

Kingsley Introduction to Diffusion Tensor Imaging Mathematics, Concepts in Magnetic Resonance Part A, 2006, vol. 28 A.

(Continued)

*Primary Examiner* — Susan Lee
(74) *Attorney, Agent, or Firm* — Schiff Hardin LLP

(57) ABSTRACT

In a method and magnetic resonance (MR) apparatus for time-dependent intensity correction of diffusion-weighted MR images that are acquired with a sequence of different diffusion gradient fields, different diffusion gradient fields are associated with at least one group, with the association with groups being established so that the diffusion gradient fields that are associated with the same group satisfy an orthogonality criterion. For each group, an MR result image is created from the MR images associated with the group, such that the MR result image has a suppressed direction dependency of the diffusion weighting in comparison to the constituent MR images. An intensity correction can be made based on the multiple MR result images and used to correct the constituent MR images.

18 Claims, 9 Drawing Sheets

(56) References Cited

U.S. PATENT DOCUMENTS

| | | | |
|---|---|---|---|
| 8,008,915 B2* | 8/2011 | Ookawa | G01R 33/5615 |
| | | | 324/307 |
| 8,019,142 B2* | 9/2011 | Nowinski | A61B 5/055 |
| | | | 382/131 |
| 8,140,144 B2* | 3/2012 | Dale | A61B 5/055 |
| | | | 382/128 |
| 8,295,575 B2* | 10/2012 | Feldman | G06K 9/6252 |
| | | | 600/410 |
| 8,577,112 B2* | 11/2013 | Mori | G01R 33/56341 |
| | | | 324/307 |
| 2003/0214290 A1 | 11/2003 | van Muiswinkel et al. | |
| 2004/0071324 A1 | 4/2004 | Norris et al. | |
| 2007/0167732 A1 | 7/2007 | Zwanger | |
| 2009/0212772 A1 | 8/2009 | Ookawa | |
| 2010/0171498 A1 | 7/2010 | Auslender et al. | |
| 2011/0199084 A1* | 8/2011 | Hasan | G01R 33/56341 |
| | | | 324/309 |
| 2011/0304334 A1* | 12/2011 | Feiweier | G01R 33/56341 |
| | | | 324/314 |
| 2012/0259199 A1 | 10/2012 | Huwer et al. | |
| 2012/0280686 A1* | 11/2012 | White | G01R 33/56341 |
| | | | 324/309 |
| 2013/0221965 A1 | 8/2013 | Nistler et al. | |

OTHER PUBLICATIONS

Weishaupt et. al; "Wie funktioniert MRI?"; 6the Edition. Auflage; pp. 78-81; Chapter 11, Springer Verlag; 2009.

Tuch et al., "High Angular Resolution Diffusion Imaging Reveals Intravoxel White Matter Fiber Heterogeneity," Magnetic Resonance in Medicine, vol. 48 (2002), pp. 577-582.

Alexander et al , "Analysis of Partial Volume Effects in Diffusion-Tensor MRI," Magnetic Resonance in Medicine, vol. 45 (2001), pp. 770-780.

Lu et al., "Three-dimensional characterization of non-gaussian water diffusion in humans using diffusion kurtosis imaging," NMR Biomed., vol. 19 (2006), pp. 236-247.

Wedeen et al., "Mapping Complex Tissue Architecture With Diffusion Spectrum Magnetic Resonance Imaging," Magnetic Resonance in Medicine, vol. 54 (2005), pp. 1377-1386.

* cited by examiner

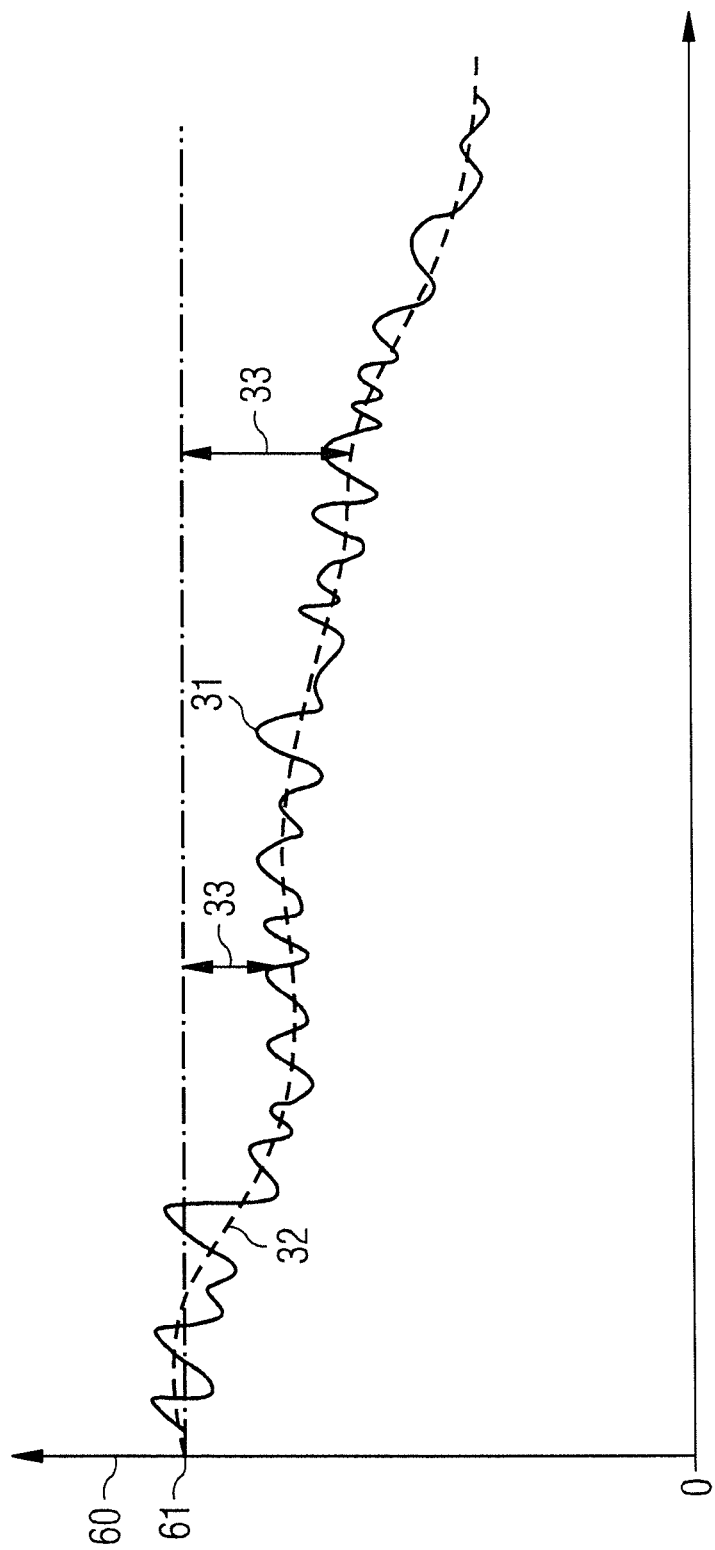

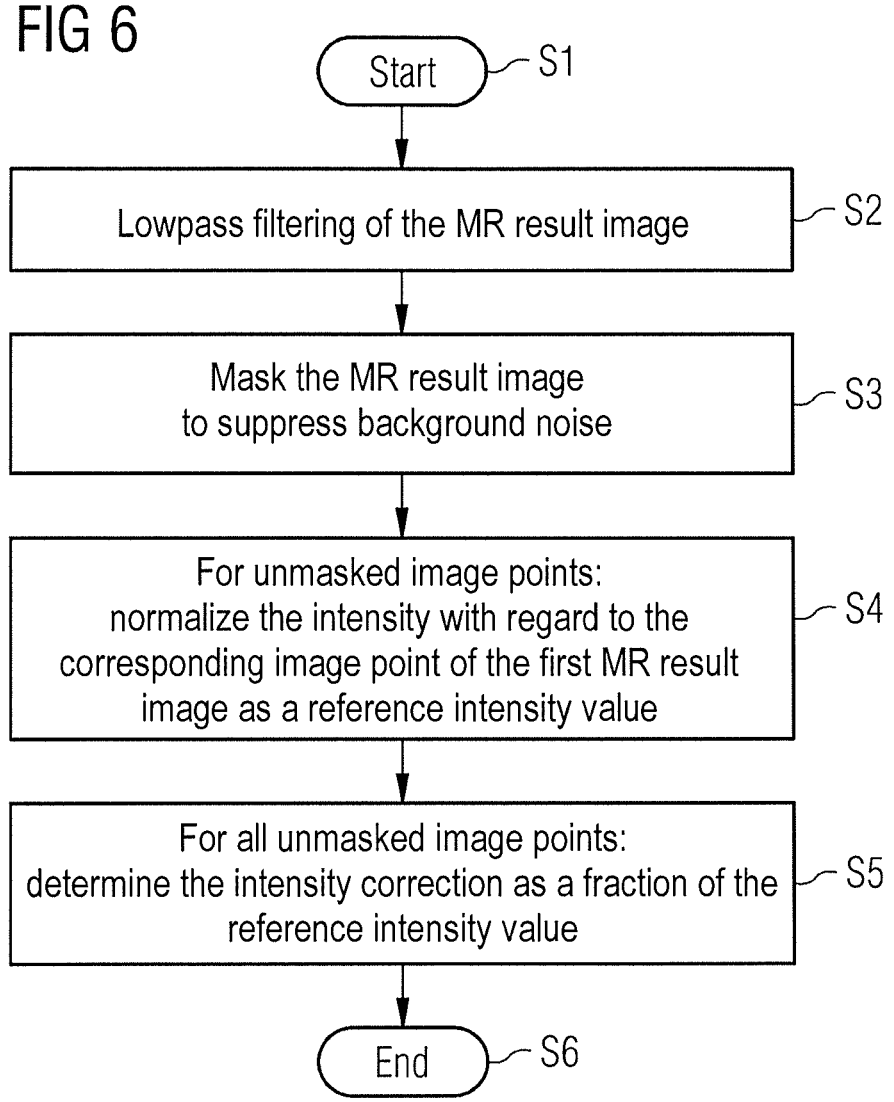

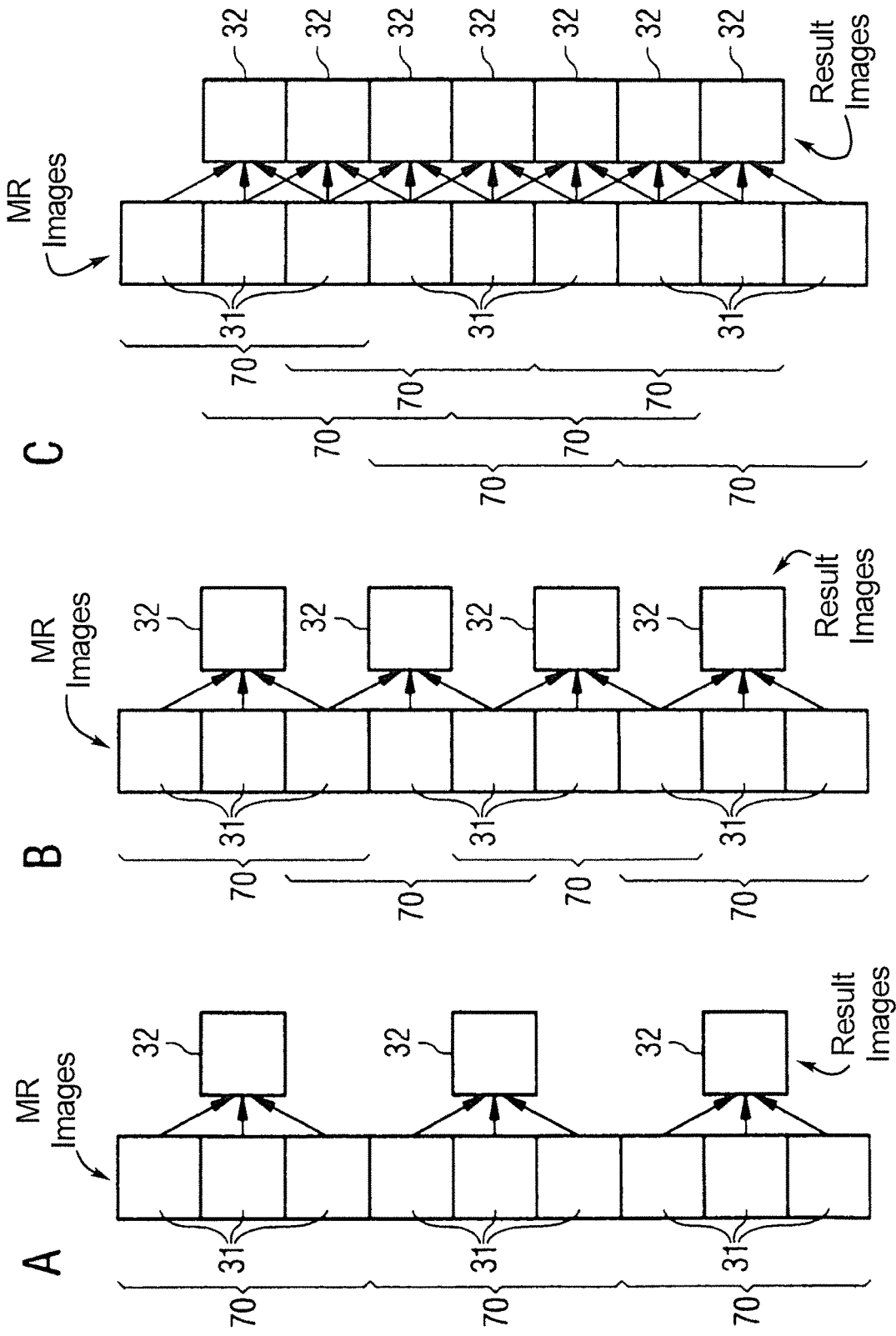

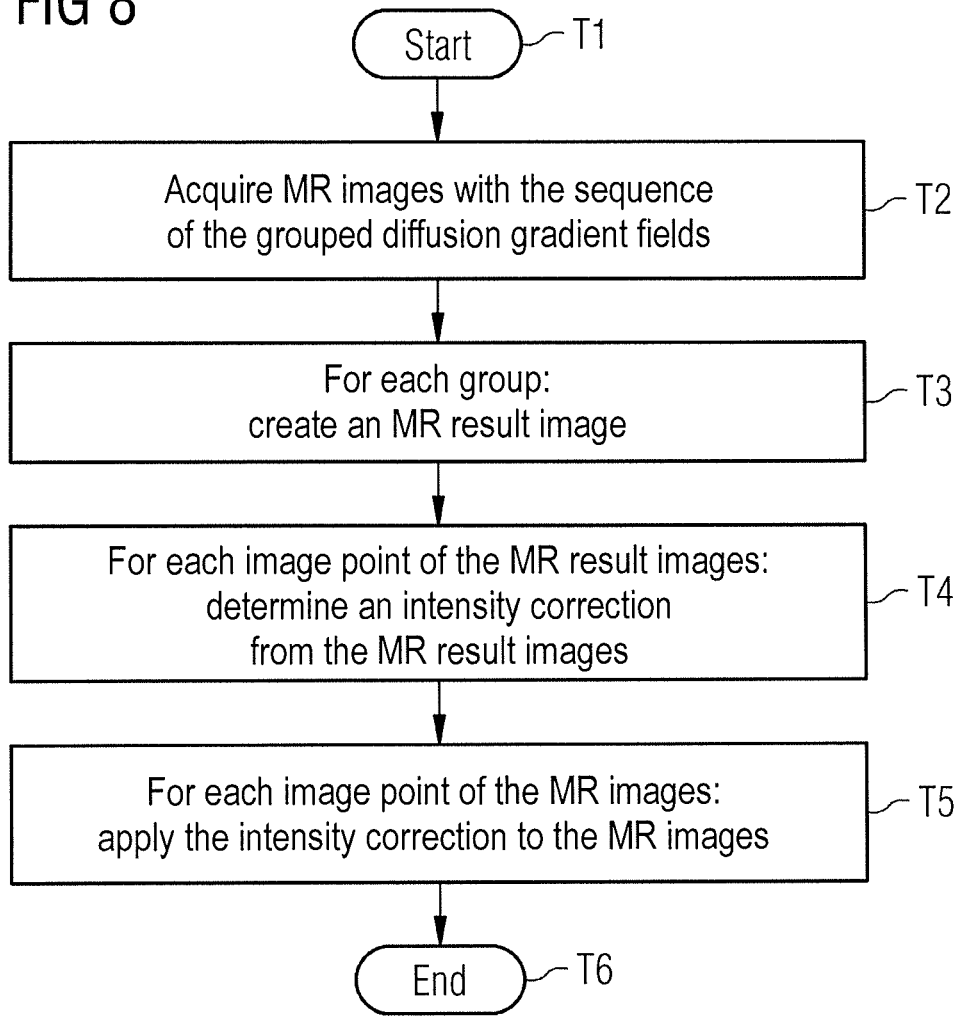

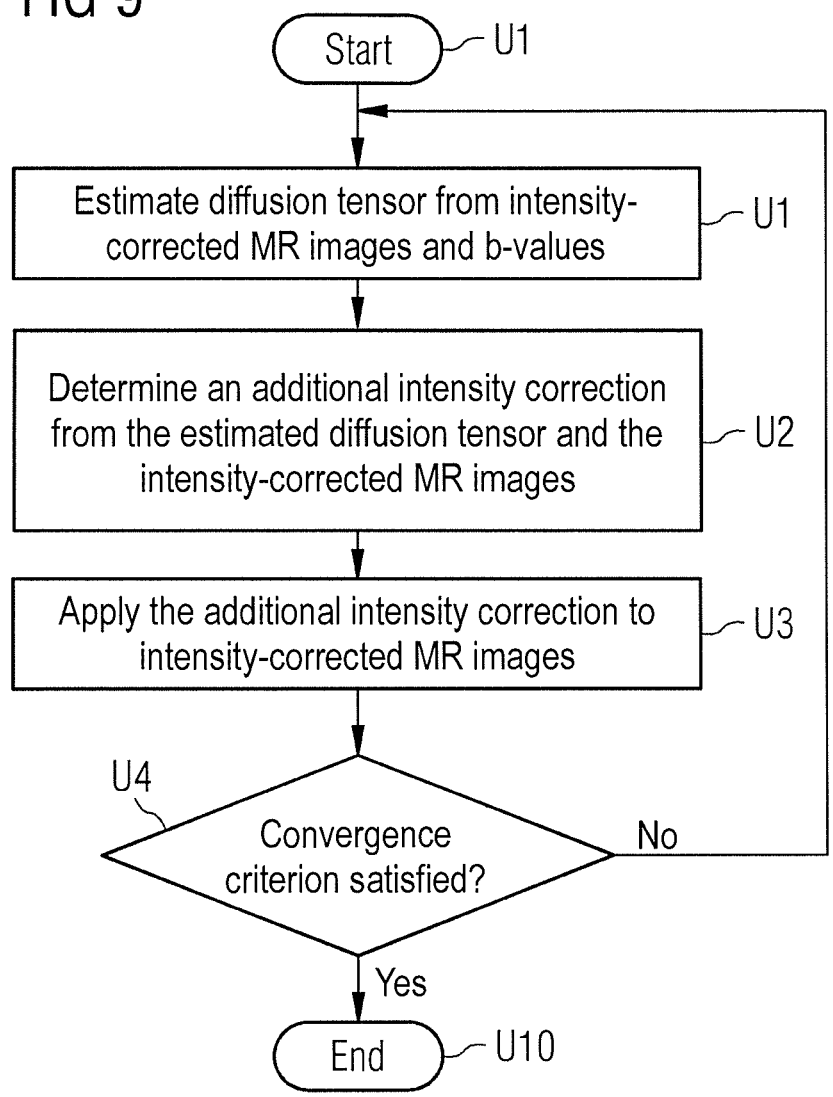

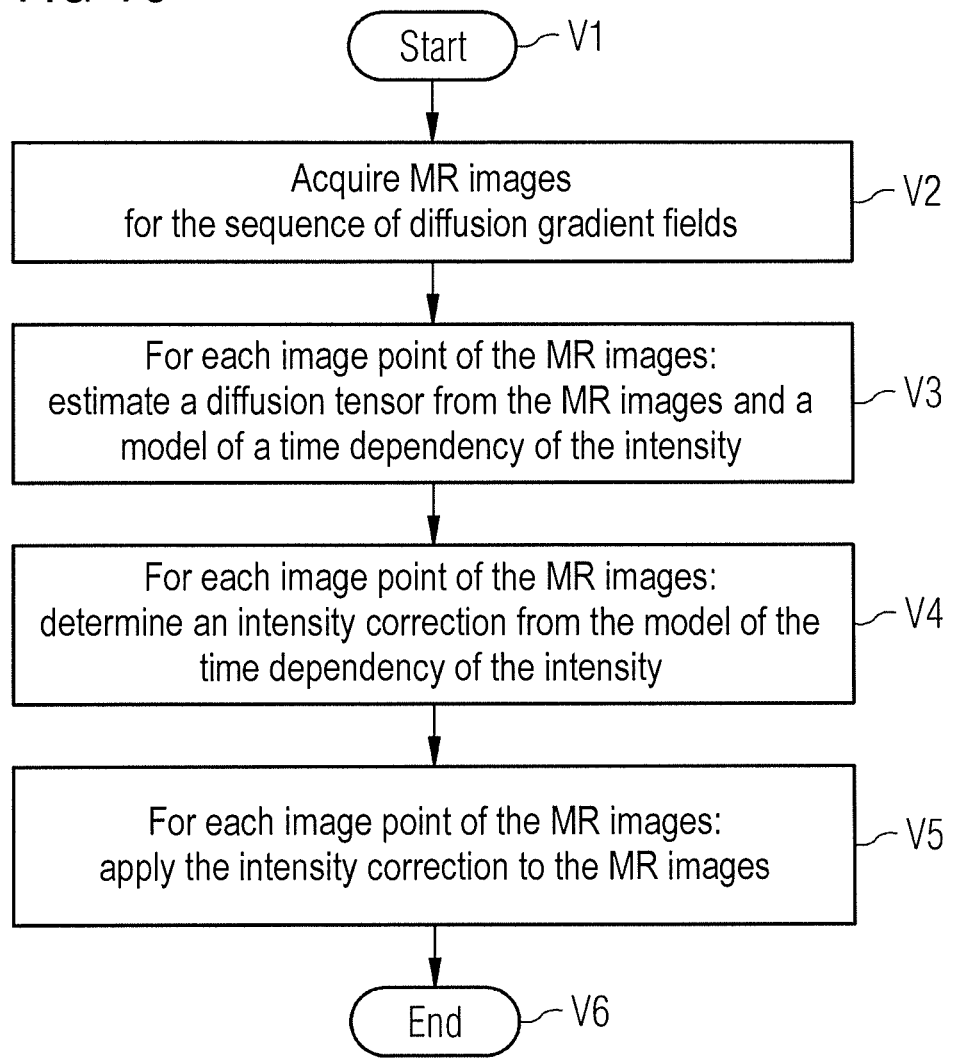

METHOD AND MAGNETIC RESONANCE SYSTEM FOR TIME-DEPENDENT INTENSITY CORRECTION OF DIFFUSION-WEIGHTED MR IMAGES

BACKGROUND OF THE INVENTION

Field of the Invention

The present invention concerns techniques for time-dependent intensity correction of diffusion-weighted magnetic resonance MR images that are acquired with a sequence of different diffusion gradient fields.

Description of the Prior Art

In routine clinical settings, diffusion-weighted magnetic resonance (MR) images can provide important diagnostic information, for example in stroke and tumor diagnostics. In diffusion-weighted MR imaging, diffusion gradient fields are switched (activated) in defined directions, and the resulting diffusion of water molecules along the applied diffusion gradient fields typically weakens the measured MR signal. In areas with lesser (greater) diffusion, a smaller (larger) signal attenuation thus typically takes place, such that these areas can have an increased (reduced) signal value in an imaging MR measurement.

The strength of the diffusion weighting can be correlated with the strength of the applied diffusion gradient fields; stronger (weaker) diffusion gradient fields can typically produce a stronger (weaker) diffusion weighting of the MR images. For example, the strength of the diffusion can be derived from the diffusion weighting so a quantitative conclusion can be made. In principle, it can be desirable to achieve a particularly strong or, large diffusion weighting, since the signal-to-noise ratio (SNR) in the diffusion-weighted MR images is then particularly high. For example, a physical "diffusion" measurement variable acquired with a poor SNR can result in a lower diagnostic certainty. Clinical applications can be implemented particularly precisely or so as to be less error-prone with a high SNR.

Moreover, techniques are known that—in addition to the spatially resolved information about the strength of the diffusion—provide information about the orientation or direction of the diffusion and/or the strength of the diffusion, resolved for different spatial directions. This is in contrast to techniques that have no direction dependency of the diffusion and, for example, provide the diffusion proportional to a value averaged over the different spatial directions. For example, this can take place by means of known Diffusion Tensor Imaging (DTI) or "High Angular Resolution Diffusion Imaging" (HARDI) techniques. See, for instance, "High Angular Resolution Diffusion Imaging Reveals Intravoxel White Matter Fiber Heterogeneity" by D. S. Tuch et al. in Mag. Reson. Med. 48 (2002) 577-582. While such techniques take into account a variety of different models for angle-resolved determination of the diffusion, a common factor is that a number of differently oriented diffusion gradient fields are used to acquire the MR images. In addition to different orientations of the diffusion gradient fields, different strengths of the diffusion gradient fields can also be taken into account. Typically known measurement sequences include, for example, 30-100 diffusion gradient fields with different orientation and/or strength; the implementation of the entire diffusion imaging can then require a duration of multiple minutes to multiple hours, typically between 5 and 20 min.

Therefore, such an MR imaging can result in a significant heating of gradient coils that are used to generate the diffusion gradient fields and the spatially coding gradient fields. This is because the diffusion gradient fields for diffusion imaging can have relatively high amplitudes, long time durations and frequent repetition. In typical MR systems, depending on the structure, the heat generated by such gradients can be transferred to the radio-frequency (RF) coils—for instance an RF body coil—that are used to radiate RF pulses to deflect the magnetization out of the steady state and/or to detect an MR signal. The heating of the RF coils can result in a change of the electrical properties of the RF coil, for example due to a direct temperature dependency of the electrical components and/or due to a geometric deformation of the RF coil due to the heating (for example thermal expansion). Therefore, a time dependency of the electrical properties of the RF coil during an MR measurement can be present due to the time-dependent heating of the components of the MR system. In particular, a time-dependent amplitude of the RF pulses can result due to the heating of the RF coils, which in turn can lead to a variation of the readout angle or flip angle of the excited magnetization. This can lead to a time-dependent intensity fluctuation in the diffusion-weighted MR images.

In modern MR systems with a large tunnel opening, a particularly close spatial proximity between the gradient system and the RF coils can exist. Therefore, such MR systems can be particularly sensitive to the above-described problem of heating during diffusion imaging. Intensity fluctuations in the range of a few percent to a few tens of a percent are known to occur.

Such time-dependent intensity fluctuations can also be designated as drift and are generally not desirable because, for example, the defined diffusion can thereby be adulterated. Such intensity fluctuations in the diffusion-weighted MR images can also be designated as signal errors, for example. An ability to assess the MR images for downstream applications can be limited due to the signal error.

In order to reduce these intensity fluctuations, solutions are known (for example) that monitor the amplitude of the RF pulses in a control/regulation loop. However, such a solution typically requires additional components, such that a corresponding implementation can be error-prone and expensive.

SUMMARY OF THE INVENTION

Therefore, a need exists for improved techniques for time-dependent intensity correction of diffusion-weighted MR images. In particular, a need exists for such techniques which provide a high time resolution of the intensity correction without needing a significant additional hardware cost and simultaneously do not (or only slightly) extend the measurement duration of the diffusion imaging.

An object of the present invention is to provide an MR method and apparatus that satisfy these needs.

According to one aspect, the invention concerns a method for time-dependent intensity correction of diffusion-weighted MR images that are acquired with a sequence of different diffusion gradient fields. The method includes the acquisition of the diffusion-weighted MR images with the sequence of diffusion gradient fields, wherein different diffusion gradient fields are associated with at least one group, and wherein the association with groups is established such that the diffusion gradient fields that are associated with the same group satisfy an orthogonality criterion. For each group, the method furthermore includes the creation of an MR result image from the constituent MR images associated with the corresponding group, such that the MR result image has a suppressed direction dependency of the diffusion weighting in comparison to the constituent MR images. Furthermore, the method includes the determination of the intensity correction based on multiple MR result images and the application of the intensity correction to the constituent MR images.

The method according to the invention is based on the following insight. MR result images can be created from the constituent MR images, such that the MR result images have no or only a slight direction dependency of the diffusion weighting. This can mean that the diffusion weighting of the MR result images is invariant with regard to a direction or rotation of the subject. Intensity variations over time and/or space in the MR result images can therefore depend less strongly or not at all on diffusion effects, in particular on a direction of diffusion gradient fields. Possible intensity fluctuations in the MR result images can in particular concern systematic errors that, for example, can in particular result from heating effects. These intensity fluctuations can be quantified by means of the MR result images and be removed or, respectively, computed out of the MR images (intensity correction). The techniques to create the MR result images are hereby not particularly limited, and the most different embodiments according to the invention are covered.

In other words, the method can concern the time-dependent intensity correction of MR images of a diffusion imaging. Intensity correction means removing or reducing an intensity fluctuations of image point values of individual image points of the MR images that are due to something other than diffusion. This can concern those intensity fluctuations that are due to time-dependent heating of different MR components. Intensity can be equal or proportional to the image point value or equal or proportional to an amplitude of an MR signal from which the image point value is determined. The determination of the intensity correction can occur individually for different image points (per image point) of the respective MR result image, for example. The application of the intensity correction can occur individually for different image points of the respective MR image, for example.

In other words, the diffusion gradient fields can be diffusion-coding gradient fields ("diffusion gradient fields"). The diffusion gradient fields can change (for example reduce) a signal value of nuclear magnetic moments moving along the corresponding direction. For example, a pair of diffusion gradient fields for a single MR image can vary a basic magnetic field along a predetermined direction by a predetermined absolute value before and after a 180° RF pulse. In principle, corresponding techniques to generate the diffusion-weighted MR images by means of the diffusion gradient fields are known to those man skilled in the art, for instance from "Wie funktioniert MRI?" ["How does MRI work?"] by Weishaupt et al., appearing in Springer Medizin Verlag Heidelberg (2009), such that no further details need to be explained herein.

In other words: intensity-corrected MR images can be obtained via the application of the intensity correction. The diffusion-weighted and intensity-corrected MR images can subsequently be assessed for special imaging or, respectively, evaluation techniques (data analysis), for instance by means of the DTI technique; see P. B. Kingsley "Introduction to Diffusion Tensor Imaging Mathematics" in Concepts Mag. Reson. Part A 28A (2006) 101. It is also possible to use the intensity-corrected MR images downstream for other techniques for data analysis, for instance those which take into account multiple diffusion tensors ("Analysis of partial volume effects in diffusion-tensor MRI" by A. L. Alexander in Proc. Intl. Sot. Mag. Reson. Med. 8 (2000) 781) or diffusion kurtosis imaging ("Three-dimensional characterization of non-Gaussian water diffusion in humans using diffusion kurtosis imaging" by H. Lu in NMR in Biomed. 19 (2006) 236-247). These examples are merely illustrative and not limiting. For example, the diffusion-weighted MR images which are obtained by means of the method according to the present can also be used for nonlinear models, for example with regard to unknown parameters which are determined by adapting a model to the MR images. Examples of this are, for example, "Diffusion Spectrum Imaging" (DSI)—see in this regard V. J. Wedeen in Proc. ISMRM, 8th Annual Meeting, Denver (2000), 82—and "Mapping complex tissue architecture with diffusion spectrum magnetic resonance imaging" by Van Wedeen et al. in Magn. Reson. Med 54 (2005), 1377-1387.

Generally stated, a subsequent data analysis of the MR images acquired by means of the method according to the present aspect can be not particularly limited, and numerous techniques can be applied. The intensity correction according to the invention can namely already be applied earlier, and be wholly or partially independent of the subsequent data analysis.

For example, the diffusion gradient fields that are used can be established based on the type and manner of the subsequent data analysis. For example, for DTI it can be unnecessary to acquire diffusion gradient fields with different strengths, while precisely this can be desirable for kurtosis imaging. It can frequently be desirable to acquire MR images for diffusion gradient fields that are distributed uniformly across all spatial directions (thus for example in three-dimensional space). Those and corresponding aspects can be taken into account with regard to the diffusion gradient fields that are used.

While the strength and orientation of the diffusion gradient fields that are used can be significant to the ability to implement the subsequent data analysis, in general the order (thus a sorting or sequence with which the associated MR images are acquired) of the diffusion gradient fields that are used can, however, be of greater importance to the subsequent analysis since (for example) a resorting of the MR images can occur before the data analysis. The order of the diffusion gradient fields can be predetermined; however, it is also possible that the method includes: planning the order of diffusion gradient fields. In this regard it is possible that the diffusion gradient fields are predetermined (for example depending on the subsequent data analysis) and the order is planned so that the association with the groups is established according to the invention, and the orthogonality criterion is satisfied.

For example, the orthogonality criterion can designate a criterion which concerns a defined deviation relative to the orthogonality, for example alternately between two diffusion gradient fields. In practical terms: if two diffusion gradient fields are not completely orthogonal (perpendicular) to one another (thus enclose an angle of 90°−x with one another), the orthogonality criterion or values of x less than a threshold can thus be satisfied. For example, the orthogonality criterion concern an angle between the diffusion gradient fields that are associated with the same group. For example, the angle can amount to approximately 90° or have a difference relative to 90° that is less than or equal to a threshold. The threshold can be predetermined. For example the orthogonality criterion can have the effect that the diffusion gradient fields of a group are alternately as linearly independent of one another as possible or, respectively, are alternately as orthogonal to one another as possible. "As linearly independent as possible" can mean that a scalar product of the appertaining diffusion gradient fields, or vectors proportional or parallel to these, is less than a predetermined threshold, for example.

If the orthogonality criterion is satisfied, it is possible in a simple to create the MR result image from the MR images associated with a group. For example, the creation of the MR result image from the MR images associated with the corresponding group can include the calculation of the geometric mean of the MR images of the corresponding group as an MR result image. In a particularly simple case in which the MR images associated with a group are alternately situated orthogonal to one another, the MR result image can then correspond to a trace-weighted MR result image. The trace-weighted MR result image can have no (or a strongly suppressed) direction dependency of the diffusion weighting. The MR result image can be designated as trace-weighted since its image point values are a function of the trace (sum of the diagonal elements) of the underlying diffusion tensor, and the trace is invariant with regard to rotation of the diffusion tensor (direction-independent). The trace can in particular be independent of the reference coordinate system in which the diffusion tensor is expressed. Given a less restrictive orthogonal criterion (meaning that deviations relative to complete orthogonality are permissible), the MR result image can be designated as pseudo-trace-weighted. This can be the case if the MR images which are associated with the same group are not situated completely orthogonal to one another and, for example, relate to each other by an angle that is different than 90°. In such a case, the MR result images have a slight remaining direction dependency of the diffusion weighting. Moreover, the effect of a more flexible selection of the diffusion gradient fields and/or their order can be achieved.

For example, the orthogonality criterion can be described by the following equation:

$$\max(|DV_1 \cdot DV_2|, |DV_1 \cdot DV_3|, |DV_2 \cdot DV_3|) < S, \quad (1)$$

max(a,b,c) is a function that produces the maximum of a, b and c as a function value. $DV_i$ is the i-th diffusion gradient (normalized to a length of 1, for example) of the respective group, and S is a threshold. S can be predetermined. Full orthogonality would be present for S=0. S>0 can correspond to a less restrictive orthogonality criterion. Small values of S can allow a more flexible selection of the order of the diffusion gradient fields or of the diffusion gradient fields themselves, while at the same time pseudo-trace-weighted MR result images with a small remaining direction dependency of the diffusion weighting (remaining direction dependency of the diffusion weighting) can be obtained.

For the intensity correction of the present invention, it can be desirable to also further suppress or remove such a remaining direction dependency of the diffusion weighting. In particular in comparison to a movement correction based on the MR result images, the remaining direction dependency of the diffusion weighting can be a particular hindrance to the intensity correction: in the movement correction, an image registration can typically tolerate slight intensity fluctuations due to the remaining direction dependency of the diffusion weighting since contours can be significant (in contrast to absolute image point values). However, in the intensity correction it can be desirable to particularly strongly suppress the intensity fluctuations due to the remaining direction dependency of the diffusion weighting.

The most varied embodiments can result in the remaining direction dependency of the diffusion weighting being suppressed or removed, or an improvement in the intensity correction of the MR images. For example, in a particularly simple embodiment, a spatial frequency space (k-space) representation of the MR result images is subjected to a low-pass filtering. The diffusion weighting can typically have a strong dependency on the location, for example have a large value of the derivative of the intensity according to the location. The remaining direction dependency of the diffusion weighting can be further suppressed or removed via the low-pass filtering of the spatial frequency space representation of the MR result images.

According to one embodiment, the method can furthermore include the iterative implementation of the following steps, respectively for different image points of the intensity-corrected MR images: estimate a diffusion tensor based on the intensity-corrected MR images and determine a further intensity correction from the estimated diffusion tensor and the intensity-corrected MR images; and apply the additional intensity correction to the intensity-corrected MR images. The iterative implementation can be terminated if a predetermined convergence criterion is satisfied.

For example, the predetermined convergence criterion can designate a variation of the diffusion tensor or individual components of the diffusion tensor between two or more successive iteration passes. It would also be possible that the convergence criterion alternatively or additionally designates a number of iteration passes, thus provides for a termination after four, or twenty, or more iterations, for example.

For example, the estimation of the diffusion tensor can include the adaptation of image point values of the diffusion tensor based on the image point values of the respective image point of the intensity-corrected MR images and based on b-values of the diffusion gradient fields.

The adaptation can be a curve adaptation or fit, with the b-values and the intensity-corrected MR images serving as input values and the diffusion tensor is adapted.

b-values are known to those skilled in the art with regard to diffusion gradient fields, represented as a b-matrix. The b-matrix describes properties of the diffusion gradient fields, for instance strength and/or orientation and/or duration, etc. The b-values can depend on a strength of the diffusion gradient fields. For example, the b-values can be understood as a simplified form of the b-matrix for the case of a single direction of diffusion gradient fields.

For example, the estimation of the diffusion tensor can take place based on the known Stejkstal-Tanner equation, or an equation derived from this. For example, the following equation is known from the aforementioned publication by P. Kingsley:

$$\ln(S_t) = -b_{xxt}D_{xx} - b_{yyt}D_{yy} - b_{zzt}D_{zz} - 2b_{xyt}D_{xy} -$$
$$-2b_{xzt}D_{xz} - 2b_{yzt}D_{yz} + \ln(S_0), \quad (2)$$

wherein $b_{xxt}$, $b_{yyt}$, $b_{zzt}$, $b_{xyt}$, $b_{xzt}$, $b_{yzt}$ are the elements of the b-matrix at various points in time, thus for various diffusion gradient fields of the sequence; $S_t$ designates the image point value of an intensity-corrected MR image (thus for example of the MR image to which the intensity correction has been applied that has been obtained from the MR result images) that is acquired at the point in time t with the corresponding diffusion gradient field. $S_0$ designates a parameter which corresponds to an MR image without any diffusion weighting (thus at b=0, for example).

The estimation of the diffusion tensor therefore take into account the complete temporal evolution $S_t$ of the image point value of a defined image point, for example. The application of the additional intensity correction to the intensity-corrected MR images can then take into account the diffusion tensor estimated in such a manner: in particular, a deviation between the image point values of the intensity-corrected MR images and the right side of Equation 2 (calculated based on the diffusion tensor) can, for example, be ascribed to the intensity fluctuation, for example due to heating:

$$\ln(St) = -b_{xx}tD_{xx} - b_{yy}tD_{yy} - b_{zz}tD_{zz} - 2b_{xy}tD_{xy} - 2b_{xz}tD_{xz} - 2b_{yz}tD_{yz} + \ln(S0) + \Delta, \quad (2a)$$

wherein $\Delta$ is the deviation. In a simple embodiment, $\Delta$ can designate the additional intensity correction that is then subtracted from the image point values of the intensity-corrected MR images $S_r$.

The iterative implementation of the steps "Estimate" and "Apply the additional intensity correction" can therefore allow the "true" diffusion tensor to be determined as precisely as possible, i.e. with a comparably small error; an improved intensity correction can thereby also be achieved for the MR images. In particular, the error can be smaller than if the intensity correction is based only on the MR result images that, for example, are calculated from a geometric mean of the MR images as (pseudo-)trace-weighted MR result images.

The association of the diffusion gradient fields with the groups can be established so that one or more of the following criteria are satisfied: a predetermined number of successive diffusion gradient fields are respectively associated with the same group, wherein the predetermined number is advantageously equal to three; no or one or two diffusion gradient fields are jointly associated with successive groups; diffusion gradient fields that are associated with the same group enclose an angle relative to one another whose difference from 90° is less than a predetermined angle threshold; diffusion gradient fields that are associated with the same group have the same b-values.

Since an MR image is associated with a diffusion gradient field, in the following these criteria are also analogously discussed for the MR images.

If one or more such criteria are satisfied, it can be particularly simply possible to create the MR result images; in particular, it can be possible that the MR result images have no or only a comparably small remaining direction dependency of the diffusion weighting. For example, three MR images belonging to the same group can always be orthogonal or essentially orthogonal to one another, and therefore alternately satisfy the orthogonality criterion, for example. If the MR result image is obtained as a (pseudo-) trace-weighted MR result image (for example from the geometric mean), it can be advantageous if the MR images of the same group have the same b-value.

At the same time, such criteria allow a small or larger number of MR result images to be obtained per time. Namely, for example, if two or three or more MR images can simultaneously be associated with successive groups, more MR result images can be created per count of MR images. The following, non-limiting example illustrates this: for example, if no (two) MR images are simultaneously associated with successive groups, two (four) MR result images can respectively be obtained per six MR images, for example given three respective MR images in each group. A lower (higher) temporal resolution of the intensity correction can be achieved in such a manner.

In the preceding, among other things techniques have been explained which allow the MR result images to have no or only a particularly slight remaining direction dependency of the diffusion weighting. In the following, techniques are explained which allow the intensity correction to be implemented based on such MR result images.

For example, the determination of the intensity correction can include the determination of a temporal scaling of the intensity from the MR result images per image point. The application of the intensity correction can include the normalization of the intensity of the MR images to a reference intensity value per image point, based on the determined temporal scaling.

In other words: a temporal evolution of the intensity can be considered in the MR result images. According to the techniques described in the preceding, it can be possible that the temporal evolution of the intensity does not result (or results as only a small proportion) from a diffusion weighting (in particular if the MR images of a group have the same b-value), but rather or, respectively, predominantly from unwanted effects as they can result given a heating of the MR components, for example. This can be the case since the MR result images can have no or only a slight remaining direction dependency of the diffusion weighting. The corresponding, possibly unwanted contribution in the temporal evolution of the intensity of the MR images can therefore be separated or calculated out.

For example, the determination of the intensity correction can include one or more of the following elements: low-pass filtering of a spatial frequency space representation of the MR result images; suppression of background noise of the MR result images; determination—for different image points of the MR result image—of a fraction of the intensity relative to a reference intensity value of the image point as an intensity correction.

The intensities of the individual image points of the MR result images can be normalized, for example, so that the reference intensity value is equal to one. For example, the reference intensity value can be the intensity value of the corresponding image point of the MR result image at t=0 or another reference time. In other words: the reference intensity value can be the intensity value of the corresponding image point of the chronologically first MR result image. The realization can be based on the fact that the heating of the MR components (and with this intensity adulteration) only increases and gains influence with progressing time.

According to a further aspect, the invention concerns a method for time-dependent intensity correction of diffusion-weighted MR images that are acquired with a sequence of different diffusion gradient fields, wherein the method includes the acquisition of the diffusion-weighted MR images with the sequence of diffusion gradient fields. For each image point of the diffusion-weighted MR images, the method furthermore includes: estimate a diffusion tensor based on the MR images and based on a model of the time dependency of the intensity. The method furthermore includes the determination of the intensity correction based on the model of the time dependency and the application of the intensity correction to the MR images.

In the method according to the presently discussed aspect, it can be unnecessary to produce a grouping of the diffusion gradient fields or, respectively, of the MR images with regard to the orthogonality criterion. In a particularly simple embodiment, the order of the diffusion gradient fields therefore must not satisfy particular criteria. This can be the case since the intensity correction can be determined individually and under consideration of the respective b-values, based on the estimated diffusion tensor for each MR image. For this purpose, the aforementioned Equation (2) can be used again or comparable equations can be used, supplemented with the model $f_t$ of the time dependency:

$$\ln(S_t) = -bxxtDxx - byytDyy - bzztDzz - 2bxytDxy - 2bxztDxz - 2byztDyz + \ln(S_0) + f_t, \quad (3)$$

The model $f_t$ of the time dependency can hereby describe the contribution to the MR images $S_t$ that is caused due to intensity fluctuations, for instance due to heating. The intensity correction can therefore be calculated based on the time-dependent model $f_t$.

Such a technique is based on the realization that the time dependency of the intensity can be approximated via the model. For example, the model can be dependent on at least one parameter and therefore can be designated as "parameter-dependent". For example, the time dependency can therefore be qualitatively predetermined (curve progression, characteristic points of the curve), wherein a quantitative adaptation can occur via the selection of parameters.

The model of the time dependency can be wholly or partially predetermined. Alternatively or additionally, the model of the time dependency can take into account one or more of the following effects: a time-dependent heating of gradient coils; a polynomial dependency of the intensity on the time; a trigonometric dependency of the intensity on the time; a spatial dependency between different image points.

It is also possible that the spatial dependency is taken into account as a boundary condition in relation to adjacent image points. It is alternatively or additionally also possible that the polynomial and/or trigonometric dependency is taken into account as a series expansion up to a predetermined order.

For example, the model can thus be described by the following functions:

$$f_t = k_1 t + k_2 t^2 + k_3 t^3 + k_4 t^4 + \ldots, \quad (4)$$

or $$f_t = k_1 \sin\left(\frac{\pi \cdot t}{2(N-1)}\right) + k_2 \sin\left(\frac{\pi \cdot t}{N-1}\right) + k_3 \sin\left(\frac{3\pi \cdot t}{2(N-1)}\right) + k_4 \sin\left(\frac{2\pi \cdot t}{N-1}\right)' + \ldots, \quad (5)$$

wherein $k_i$ designates the parameter of the different elements of the series expansion and $0 \le t \le N-1$, wherein t indicates the times of the MR images (as in Equation 2 and 3). In Equations (4) and (5), the order would be equal to four; however, it is possible to consider higher or lower orders. The solution for adjacent image points can be considered as a boundary condition in Equations 4 and 5, for example. The estimation of the diffusion tensor corresponding to the aforementioned equation can, for example, furthermore include: determine the parameter of the model and/or of the diffusion tensor by adaptation (what is known as "fitting"). In one embodiment, the diffusion tensor and the parameter $k_i$ can hereby be determined in one and the same adaptation routine, thus in one and the same fit.

For example, according to the present aspect it is possible that, in the sequence of diffusion gradient fields, at least some successive spoiler gradient fields have different b-values. Alternatively or additionally, it is possible that—in the sequence of diffusion gradient fields—a spatial derivative of successive diffusion gradient fields assumes a value that is greater than a predetermined change threshold.

It should be understood that, in the further aspect of the present invention which is based on the determination of the MR result images as (pseudo-)trace-weighted images, it is not possible (or is possibly only to a limited extent) to use different b-values.

For example, if successive diffusion gradient fields have different b-values or, respectively, different strengths of the diffusion gradient fields in the presently discussed aspect, this can be advantageous with regard to successive analysis techniques. For example, different instances of the aforementioned techniques for the evaluation of the diffusion-weighted MR images can take into account the different b-values, which can enable an increased precision in the data analysis.

For example, the method can furthermore include: plan the sequence of the diffusion gradient fields so that successive diffusion gradient fields have a spatial derivative that is greater than the predetermined change threshold. If the spatial derivative of successive diffusion gradient fields assumes a value that is greater than the predetermined change threshold, this can have the effect that the diffusion weighting of the diffusion-weighted MR images has a strong time dependency since successive MR images can be acquired with diffusion gradient fields which have a very different orientation, for example. In other words, this can have the effect that intensity fluctuations in the MR images that arise due to the diffusion weighting have a strong time dependency. In contrast to this, it can be possible that intensity fluctuations in the MR images which arise due to a heating of the different MR components have a comparably small time dependency, thus change only slowly with time. If the sequence of the diffusion gradient fields is established to the effect that the spatial derivative of the diffusion gradient fields assumes a large value, an accordingly good discrimination can be made between the comparably fast intensity fluctuations due to the diffusion weighting and the comparably slow intensity fluctuations due to the heating.

According to a further aspect, the invention concerns an MR system that is designed for time-dependent intensity correction of diffusion-weighted MR images that are acquired with a sequence of different diffusion gradient fields. The MR system has a reception that is operable to acquire diffusion-weighted MR images with the sequence of diffusion gradient fields, and wherein various diffusion gradient fields are associated with at least one group, wherein the association with groups is established so that the diffusion gradient fields that are associated with the same group satisfy an orthogonality criterion. The MR system furthermore has a computer configured to implement the following steps: for each group, create an MR result image from the MR images associated with the corresponding group so that said MR result image has a suppressed direction dependency of the diffusion weighting in comparison to the MR images; and determine the intensity correction based on multiple individual MR result images; and apply the intensity correction to the MR images.

The invention also concerns a further MR system that is also designed for time-dependent intensity correction of diffusion-weighted MR images that are acquired with a sequence of different diffusion gradient fields. This MR system also has a reception unit that is operable to acquire the diffusion-weighted MR images with the sequence of diffusion gradient fields. This MR system furthermore has a computer that is configured to implement the following steps: for each image point of the diffusion-weighted MR images, estimate a diffusion tensor based on the MR images and based on a model of the time dependency of the intensity; and determine the intensity correction based on the model of the time dependency of the intensity; and apply the intensity correction to the MR images.

For such MR systems according to the presently discussed aspects, effects can be achieved which are comparable to the effects which can be achieved for the method for time-dependent intensity correction of diffusion-weighted MR images according to further aspects of the present invention.

The features presented above and features that are described in the following can be used not only in the corresponding, explicitly present combination, but also in additional combinations or in isolation, without departing from the scope of the present invention. In particular, features of the method for time-dependent intensity correction according to the various aspects of the present invention can be combined with one another. For example, features which—with regard to the method for time-dependent intensity correction in which an association of diffusion gradient fields with groups is present can be combined with the features with regard to the method for time-dependent intensity correction according to the further aspect of the invention in which the model of the time dependency of the intensity is taken into account.

BRIEF DESCRIPTION OF THE DRAWINGS

FIG. 5 illustrates a temporal scaling of the intensity for an image point of a diffusion-weighted MR image and an MR result image with suppressed direction dependency of the diffusion weighting, as well as a reference intensity value.

FIG. 6 is a flow diagram for the determination of the intensity correction.

FIG. 7 illustrates techniques to determine the MR result images as trace-weighted MR result images or, respectively, as pseudo-trace-weighted MR result images.

FIG. 8 is a flowchart for a method for time-dependent intensity correction according to one aspect of the invention.

FIG. 9 is a flowchart for an embodiment of the method of FIG. 8 which includes an iterative estimation of the diffusion tensor.

FIG. 10 is a flowchart for a method for time-dependent intensity correction according to a further aspect of the invention which takes into account a model of a time dependency of the intensity.

DESCRIPTION OF THE PREFERRED EMBODIMENTS

In the following, the present invention is explained in detail using preferred embodiments with reference to the drawings. The various embodiments pertain to techniques which enable a time-dependent intensity correction of diffusion-weighted MR images. In various embodiments, MR result images are hereby created from the MR images, which MR result images have a suppressed—thus no or only a slight—direction dependency of the diffusion weighting (remaining direction dependency of the diffusion weighting), in particular in comparison to the MR images. A temporal scaling of the intensity of individual image points of the MR result images can then be removed from the MR images so that the remaining scaling of the intensity is predominantly to be associated with the diffusion weighting. Unwanted contributions to the intensity—for instance from the heating of MR components—can be reduced or eliminated in such a manner.

Moreover, various embodiments concern techniques which are based on a determination of the diffusion tensor based on the MR images (for example intensity-corrected by means of the MR result images). Via the determination of the diffusion tensor, a possible temporal scaling of the intensity that remains in the MR images due to the heating can be further suppressed. It should be understood that, independent of the use of a diffusion tensor, subsequent data analysis in diffusion imaging is not limited to the use of a diffusion tensor model.

Figure 1:
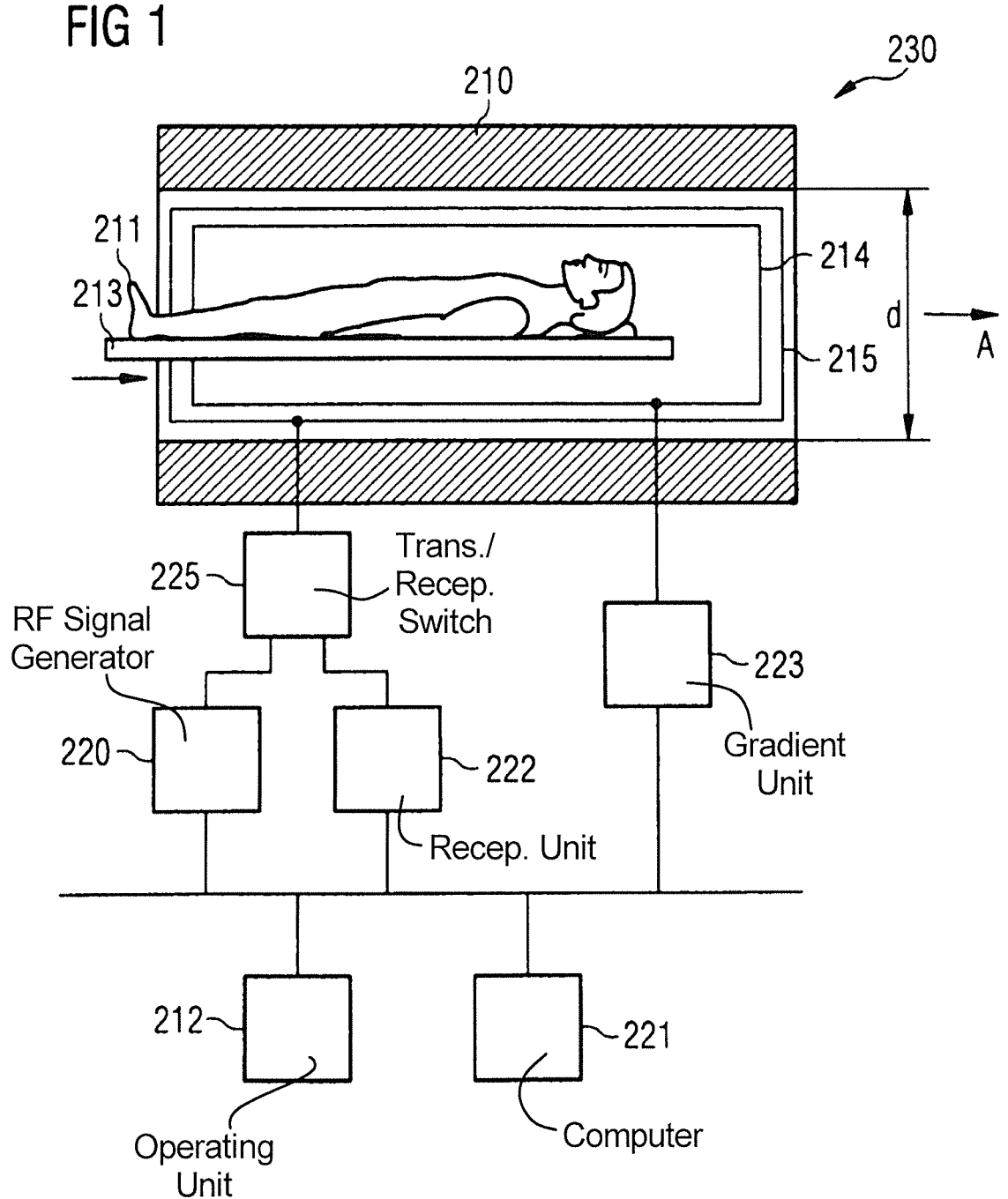
FIG. 1 schematically illustrates an MR system that is operable for implementation of techniques according to the invention.

FIG. 1 schematically shows a magnetic resonance (MR) system 230 according to an embodiment of the present invention. The MR system 230 has a magnet 210 to generate a basic magnetic field. For example, the magnet 210 can be a tube magnet and the basic magnetic field can be situated parallel to the longitudinal axis of the tube. The longitudinal axis of the tube designates a first direction A. The diameter of the tube is labeled with d.

An examination subject (here an examined person 211) can be slid on a recumbent table 213 through the tube, into the magnet 210. The table 213 is positionable along the direction A. The MR system 230 furthermore has a gradient system 214 to generate magnetic field gradients that can be used for the imaging and/or spatial coding of acquired MR data and/or for diffusion imaging [sic] for diffusion coding (diffusion gradient fields). The gradient system 214 typically comprises at least three separately controllable coils or coil sets which enable it to apply and switch the gradient fields along arbitrary spatial directions (gradient axes). The corresponding coils are designated as channels of the gradient system 214.

One or more radio-frequency (RF) coils 215—for instance an RF coil arrangement or a body coil—are provided to excite the polarization or, respectively, alignment of the magnetization of the nuclear spins (nuclear magnetic moments) resulting in the basic magnetic field. These one or more radio-frequency coils 215 can radiate an amplitude-modulated RF excitation pulse into the examined person 211 in order to deflect the magnetization out of the steady state (typically parallel to the basic magnetic field), i.e. to generate a transversal magnetization (orthogonal to the basic field). An RF signal generator 220 with amplitude modulation unit is used to generate such RF excitation pulses. This amplitude modulation unit is coupled with the RF coil 215 via a transmission/reception switch [diplexer?] 225. To control the gradient system 214, a gradient unit 223 is provided. A reception unit 222 of a reception system 225 receives MR signals of the relaxing transversal magnetization (spin echoes or gradient echoes etc.). For this, the reception unit 222 is coupled with the RF coil 215 via the transmission/reception switch 225.

An operating unit 212 allows the input and output from and to a user of the MR system 230. The operating unit 212 can comprise a monitor, a keyboard, a mouse, storage media, data connections etc., for example.

Furthermore, a computer 221 is provided that can be used to plan and implement the diffusion imaging. The computer 221 can be a separate unit or, for example, can be implemented as a functional unit, for example as software and/or hardware in a system computer of the MR system 230, or also externally.

Figure 2:
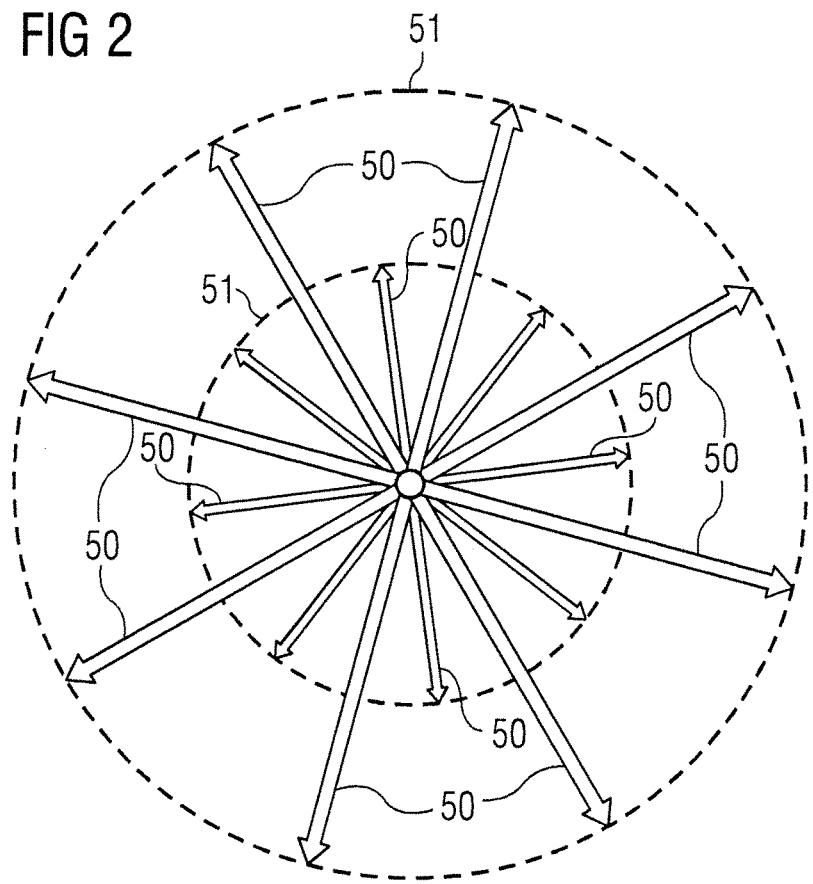
FIG. 2 is a two-dimensional view of the orientation of diffusion gradient fields.

For diffusion imaging, diffusion-weighted MR images are initially acquired. For this, diffusion gradient fields 50 (see FIG. 2) are generated by the gradient unit 223 by means of the gradient system 214 in different spatial directions (in three-dimensional space) and/or with different strengths. In FIG. 2, only a two-dimensional view is presented for reasons of clarity. The directions in FIG. 2 can related to the Bz components of the magnetic field B, for example, thus designate dBz/dx, dBz/dy, dBz/dz, for example, wherein x, y, z describe the spatial directions. The diffusion gradient fields 50 moreover have a defined duration. The diffusion gradient fields are typically applied in double pairs before and after a 180° RF pulse, wherein the diffusion gradient fields associated with a double pair have a defined temporal spacing. What is known as the b-value 51, which in FIG. 2 corresponds to a length of the vectors and is schematically illustrated by the dashed circle for two values, is proportional to the strength of the diffusion gradient fields.

For example, between 10 and 100 different diffusion gradient fields can typically be used to acquire a corresponding number of MR images. Such a measurement can have durations in the range of minutes or hours. In principle, the following trend can be formulated: the greater the number of diffusion gradient fields, the greater the precision in the determination of the diffusion values. For example, the b-values can lie in a range from 0-2000 s/mm$^2$, advantageously around 1000 s/mm$^2$. Diffusion-weighted MR images which are acquired with a low b-value (for example 0-50 s/mm$^2$) typically have a significantly different intensity relative to MR images that are strongly diffusion-weighted, for instance with b=1000 s/mm$^2$.

Figure 3:
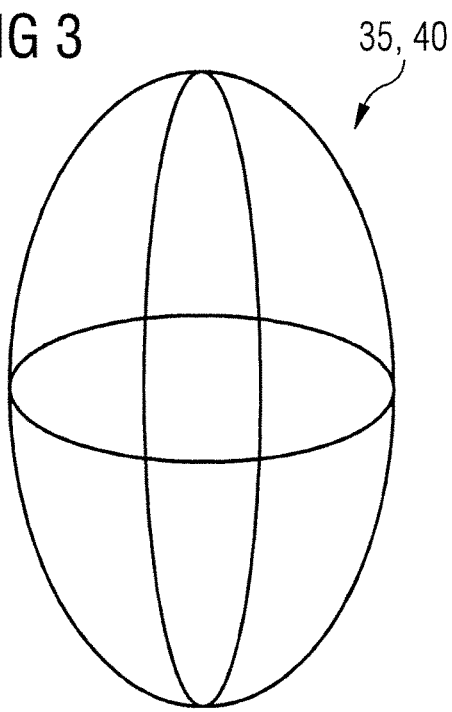
FIG. 3 graphically illustrates a diffusion tensor as an ellipse.

For example, a diffusion tensor 40 can be calculated for each image point 35 from the diffusion-weighted MR images via suitable techniques (see FIG. 3). The diffusion tensor 40 can be graphically represented as an ellipse, wherein the major axes of the ellipse are aligned along its eigenvectors. Depending on the reference coordinate system in which the diffusion tensor 40 is presented, the plots of the tensor have different values. For example, the trace of the diffusion tensor 40 is invariant with regard to the reference coordinate system. The corresponding techniques to calculate the diffusion tensor 40 are known to the man skilled in the art, for example within the scope of DTI.

Figure 4:
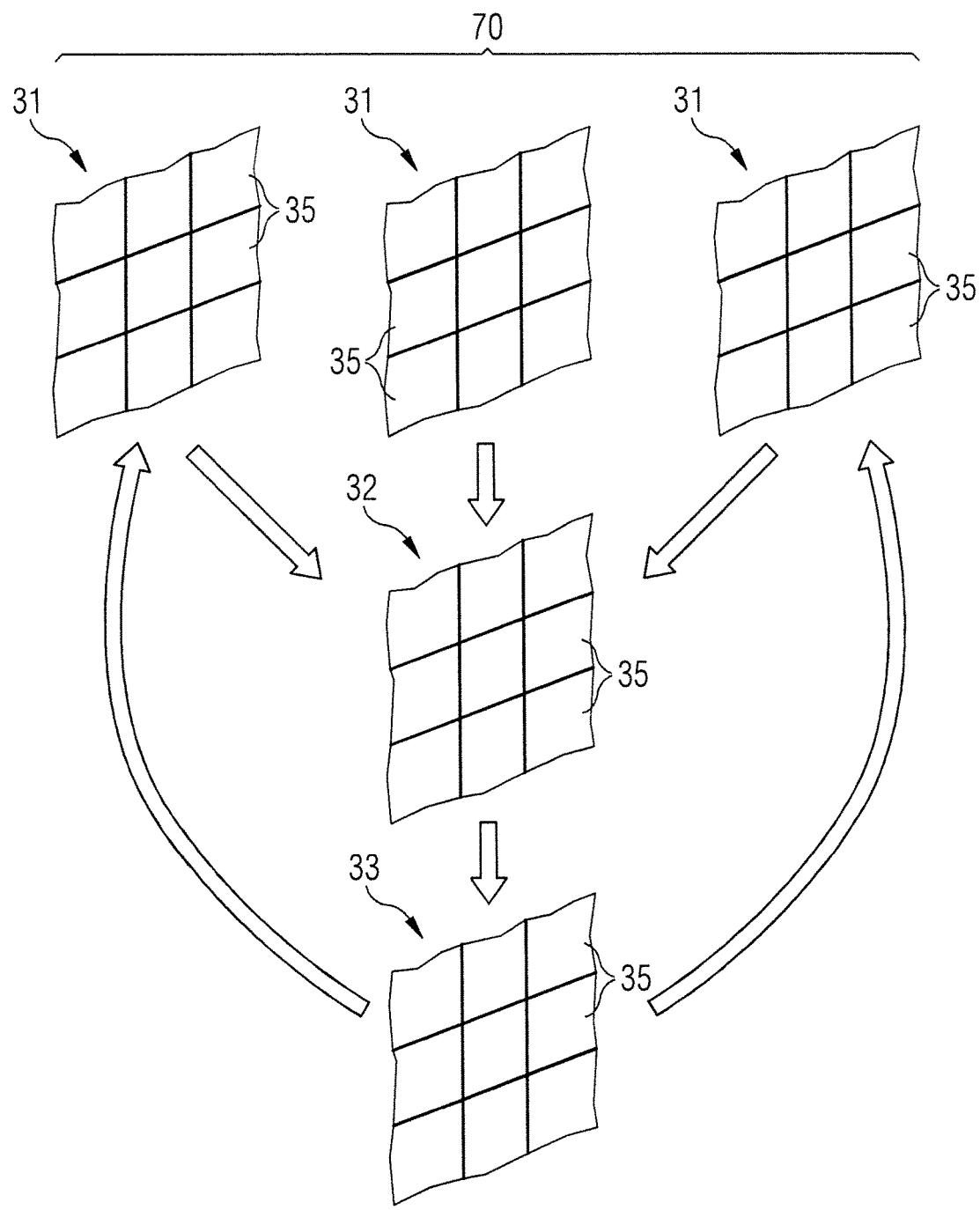
FIG. 4 schematically illustrates diffusion-weighted MR images, MR result images with suppressed direction dependency of the diffusion weighting and an intensity correction determined from the MR result images.

The dependencies between the diffusion-weighted MR images 31, the MR result image 32 (which has a reduced or suppressed direction dependency of the diffusion weighting) and the intensity correction 33 are schematically presented in FIG. 4. The aforementioned variables are respectively defined for the various image points 35 (per image point). Depending on the embodiment and aspect of the present invention, for example, it is possible that a single MR result image 32 is obtained from a group 70 with three associated diffusion-weighted MR images 31. The intensity correction 33 determined using the MR result image 32 can then in turn be applied to all three MR images 31 of the group 70. FIG. 4 is not limiting: it would also be possible that one MR result image 32 or another number is obtained per diffusion-weighted MR image 31.

The intensity correction 33 is illustrated in detail with regard to FIG. 5. The curve of the intensity 60 (of a defined image point 35) over time is shown; the solid line hereby designates the intensity 60 of the diffusion-weighted MR image 31, and the dashed line designates the intensity of the MR result image 32. The intensity correction 33 is drawn as a difference relative to an intensity reference value 61 (dot-dash line). In the embodiment of FIG. 5, the intensity reference value 61 is that intensity value 60 that is obtained for the first MR result image 32 in the chronological sequence. In general, a different intensity reference value 61 can also be used.

As is clear from FIG. 5, both the diffusion-weighted MR images 31 and the MR result images 32 have a time dependency of the intensity 60. The time dependency of the intensity 60 of the diffusion-weighted MR images 41 is superimposed on the time dependency of the intensity 60 of the MR result images 32: while a portion of the time dependency of the intensity 60 of the diffusion-weighted MR images 31 occurs due to the use of different diffusion gradient fields 50 (i.e. is based on the diffusion weighting), a further portion is produced via, for example, time-dependent variation of the temperature of specific components of the MR system 230. The first cited component is suppressed in the MR result images 32 which, as (pseudo-)trace-weighted images, have no or only a slight direction dependency of the diffusion weighting.

With regard to the component of the intensity 60 that is caused by heating: since a plurality of strong diffusion gradient fields 50 are used in diffusion imaging, as has been described in the preceding the gradient coils of the gradient system 214 can heat up in the course of the measurement. The gradient system 214 typically has a close spatial proximity to the RF coils 215, such that these are also heated as a result of the heating of the gradient system 214. This can in particular be the case for those MR systems 230 which have a large diameter d of the tube of the magnet 210. Heating of the RF coils 215 can in turn produce a variation of the electrical properties and/or of the arrangement and shape of the RF coils 215. If some or all of these parameters vary, this can have the effect that the amplitudes of the alternating magnetic fields emitted by the RF coils 215 (to excite the nuclear magnetization) vary over time. For example, in particular a deflection angle of the nuclear magnetization can then be varied from its steady state. A modified deflection angle of the nuclear magnetization out of its steady state in turn is reflected in a time-dependent change of the intensity 60 as it is shown in FIG. 5 in relation to the MR result images 32 and MR images 31. This time-dependent variation of the intensity 60 due to heating of the MR components 214, 215 can be an unwanted side effect, and techniques are presented in the following which allow an intensity correction to be implemented that reduces or remedies these effects.

It should be understood that FIG. 5 is illustrative in multiple regards. The contributions of the intensity 60 due to direction dependencies of the diffusion weighting (only a solid line) and heating (dashed line and solid line) have different time dependencies in FIG. 5. In general, each of the two contributions can have different time dependencies; for example, in particular the time dependency of the contribution from the direction dependency of the diffusion weighting can have a faster or slower time dependency. This can be affected by the sequence of the diffusion gradient fields 50, in particular their direction. However, an amplitude of the contributions of the intensity 60 from diffusion weighting on the one hand and heating on the other hand can have a different ratio than in FIG. 5. In FIG. 5, the contribution of the intensity 60 from the direction dependency of the diffusion weighting is comparably small relative to the contribution from heating (for example approximately 5-10%). However, the contribution of the intensity 60 from the direction dependency of the diffusion weighting can also assume significantly greater proportions—for example 50% or 100% or 2005—relative to the contribution from heating. For example, this can namely be affected by the b-value of the diffusion gradient fields 50.

In principle, these techniques for intensity correction 33 are based on the realization that the MR result images 32 have no or only a slight direction dependency of the diffusion weighting (remaining direction dependency of the diffusion weighting), and time dependencies of the intensity 60 therefore result from a thermal drift, for example—in particular if the MR images are acquired with the same b-values of the diffusion gradient fields 50. Given different b-values of the diffusion gradient field 50, this can additionally be taken into account in the evaluation of FIG. 5. The difference between the intensity 60 and the reference intensity value 61 (illustrated with vertical arrows in FIG. 5) can then be used to calculate the intensity correction 33. For example, the intensity correction 33 in FIG. 5 can be calculated from the fraction of the intensity value 60 of the MR result images (dashed line) in the intensity of the reference intensity value 61 (dash-dot line); a normalization of the intensity 60 can hereby occur beforehand such that the reference intensity value is equal to 1.

The determination of the intensity correction 33 using the MR result images 32 is further illustrated in the flow diagram of FIG. 6. The corresponding method starts in Step S1. A low-pass filtering of a spatial frequency space (k-space) representation of the MR result image 32 initially takes place in Step S2. The low-pass filtering in Step S2 can have the effect that a possibly remaining direction dependency of the diffusion weighting in the MR result images 32 is further suppressed or, respectively, remedied. This is the case since fluctuations of the intensity 60 due to diffusion weighting typically have a strong spatial dependency in the spatial frequency space. Low-pass filtering can suppress this contribution. Step S2 can also be designated as a spatial smoothing.

The masking of the corresponding MR result image 32 takes place in Step S3 to suppress background noise (thus signal outside of the examination subject or, respectively, in regions in which predominantly air is present). In detail, for this a binary image mask (for example values: 1 or 0) can be generated for each MR result image 32, for example; this can include: for each image point, summation of intensity values of the image point for all MR images 31; and for each image point 35, the implementation of a threshold comparison of this sum with a threshold intensity value. For example, if this sum is greater than the threshold intensity value, a value of one can be assigned to the mask at this point. In the opposite case, at this point a value of zero can be assigned to the mask. The threshold intensity value can be selected or predetermined such that values of zero are assigned to the mask at those image points 35 which are situated outside of the examination subject or, respectively, the examined person 211. A suppression of background noise can then take place by masking the corresponding image points. Steps S2 and S3 are optional steps, for example.

A normalization of the intensities 60 can then take place in Step S4 for all unmasked image points, meaning those image points which were assigned a value equal to one in the mask, for example. The numbering can hereby mean: normalization of the time-dependent intensity 60 so that the time-dependent intensity 60 corresponds to a value of one at t=0 (first MR result image 32). This value of one can then correspond to the reference identity value 61 (dot-dash line) in the presentation of FIG. 5.

The determination of the intensity correction 33 from the difference of the (normalized) intensity 60 of the MR result images 32 relative to the reference intensity value 61 takes place in Step S5. For example, it is possible that the intensity correction 33 corresponds to the fraction of the intensity 60 of the MR result images 32 relative to the reference intensity value 61. The application of the intensity correction to the MR images can then include the dividing of the respective image point value of the MR images 31 by the intensity correction 33.

In the example of FIG. 5, the intensity correction 33 could thus have values between 1.0 and approximately 0.5.

In the preceding, the techniques have been explained for the determination and application of the intensity correction based on the MR result images 32. These techniques are typically independent of techniques which supply the MR result images 32. In the following it is explained how the MR result images 32 can be obtained from the diffusion-weighted MR images 31 according to different aspects of the invention.

For example, in various embodiments the MR images 31 can be acquired with a defined sequence of diffusion gradient fields 50, and in fact such that the different diffusion gradient fields 50 (and therefore the MR images 31) are respectively associated with at least one group 70. The association with the groups 70 is established so that the diffusion gradient fields 50 of a group 70 respectively satisfy an orthogonality criterion and, for example, three diffusion gradient fields 50 respectively belong to a group 70 and all have the same b-values, for example.

For example, the orthogonality criterion can mean that the diffusion gradient fields 50 of a group 70 are alternately situated orthogonal or as orthogonal as possible to one another (for example flipped by <20°, advantageously <10°, particularly advantageously <3° relative to the full orthogonality). In other words: the diffusion gradient fields 50 that are associated with a group 70 are alternately optimally orthogonal to one another. The different diffusion gradient fields 60 of a group 70 moreover all have the same b-value 51, meaning that the diffusion gradient fields 50 have the same strength (however, they can have different orientation). A corresponding definition of the orthogonality criterion is the preceding Equation 1.

If, given full orthogonality (approximating orthogonality which satisfies the orthogonality criterion), the geometric mean is calculated from the diffusion gradient fields 50 associated with a group 70, the MR result image 32 that is obtained in such a manner corresponds to a trace-weighted (pseudo-trace-weighted) MR result image 32 with a very strong (strong) suppressed direction dependency of the diffusion weighting, i.e. essentially no (a slight) remaining direction dependency of the diffusion weighting.

FIG. 7 is schematically shows how three respective diffusion gradients 50 (and therefore diffusion-weighted MR images 31) can be associated with a group 70 (and therefore a trace-weighted or, respectively, pseudo-trace-weighted MR result image 32). For example, the MR images 31 of the FIG. 7 can all have the same b-value. FIG. 7 is to be interpreted as a section of a longer acquisition sequence.

In each of the three variants A through C, the diffusion-weighted MR images 31 are associated with the respective MR result images 32 such that the diffusion gradients 50 associated with the three diffusion-weighted MR images 31 of the respective group 70 are arranged optimally orthogonal to one another. The MR result images 32 can be obtained from a geometric mean calculation from the MR images 31, for example, which is graphically illustrated by the respective three connecting arrows. Alternatively, the MR result images 32 can, for example, be obtained from four MR images which have a tetrahedral arrangement of the associated diffusion gradient fields.

In principle, the sequence of diffusion gradient fields 50 or, respectively, of the associated MR images 31 can thus be significant to the satisfaction of the orthogonality criterion. Therefore—for example given a predetermined (unordered) set of diffusion gradient fields 50—a sorting can occur so that the sequence for respective successive diffusion gradient fields 50 satisfies the orthogonality criterion.

In variant A, the individual groups 70 do not divide a diffusion gradient field 50 (or MR images 31); in variant B, the individual groups 70 respectively divide a diffusion gradient field 50 (or MR image 31); and in variant C, the individual groups 70 respectively divide two diffusion gradient fields 50 (or MR images 31).

An MR result image 32 is obtained for each group 70. While a number of MR result images 32 (or, respectively, groups 70) per time interval is comparably low in the case of variant A, a more restrictive orthogonality criterion can hereby be ensured. In each of variants B and C, the time resolution of the MR result images 32 is higher, but only a less restrictive orthogonality criterion is satisfied, meaning that various diffusion gradient fields 50 of a group 70 are not completely orthogonal to one another. Since the time-dependent intensity correction 33 is significantly based on the MR result images 32, a time resolution of the intensity correction 33 can be lower for variant A than for variants B and C, for example. On the other hand, with variant A it can be possible that the remaining direction dependency of the diffusion weighting of the MR result images 32 is smaller in comparison to variants B and C. Both factors can affect a precision of the intensity correction 33.

A flowchart of a method for time-dependent intensity correction 33 is shown in FIG. 8 according to an exemplary embodiment which, for example, uses the techniques described with regard to FIG. 7 to determine the MR result images 32 from the MR images 31 associated with a group 70.

The method begins with Step T1. The acquisition of the MR images 31 with the sequence of grouped diffusion gradient fields 50 takes place in Step T2. The sequence or, respectively, grouping of the diffusion gradient fields 50 can hereby take place so that the orthogonality criterion (as it has been explained in the preceding with regard to FIG. 7) is respectively satisfied for those diffusion gradient fields 50 which are associated with a group 70.

In this regard it would be possible to provide an additional, optional step (not shown in FIG. 8) before Step T2: the optional step can include the planning of the sequence of the spatially coding diffusion gradient fields 50. For example, the number, orientation and strength of the diffusion gradient fields 50 can be predetermined, for example by the subsequent data analysis that is based on the MR images 31. In the optional step, the sequence can then be determined by sorting the diffusion gradient fields 50. The sorting can hereby take place so that successive diffusion gradient fields 50 belong to one group 70. The sorting can take place so that the diffusion gradient fields 50 of each group 70 are alternately situated optimally orthogonal to one another, i.e. satisfy the orthogonality criterion.

The creation of an MR result image 32 from the associated MR images 31 then takes place for each group 70 in Step T3. This means that an MR result image 32 is typically created from three MR images 31 associated with a group 70, for example via geometric mean calculation. Since the diffusion-weighted MR images 31 of each group 70 satisfy the orthogonality criterion and, for example, have the same b-values, the MR result image 32 created in Step T3 corresponds to a trace-weighted or a pseudo-trace-weighted MR result image 32. The MR result image 32 therefore has no or only a slight direction dependency of the diffusion weighting.

The determination of an intensity correction 33 takes place in Step T4 for each image point 35 of the MR result images 32. The application of the intensity correction 33 determined in Step T4 takes place in Step T5 for each image point 35 of the MR images 31. For example, the Steps T4 and T5 can be implemented by means of the steps described with regard to FIG. 6.

The method ends in Step T6.

It should be understood that—particularly in the case that the MR images 32 created in Step T3 are pseudo-trace-weighted MR images 32 (i.e. if the MR images 31 associated with a group 70 are not completely orthogonal to one another and/or if the b-values are not entirely identical, for example)—the MR result images 32 can have a slight remaining direction dependency of the diffusion weighting. The intensity correction of the MR images 31 can therefore be afflicted with errors. It can be desirable to also reduce or, respectively, suppress this remaining direction dependency of the diffusion weighting or, respectively, to improve the intensity correction.

Step S2 of FIG. 6 also serves for this, for example. In this regard it is also possible to implement the steps of FIG. 9 following the steps of FIG. 8, for example. This is explained in the following.

The estimation of the diffusion tensor from the intensity-corrected MR images and the b-values of the associated diffusion gradient fields takes place in Step U1. For example, this can take place with Equation 2, in which $S_t$ are the intensity-corrected MR images (thus the result of Step T5 of FIG. 8, for example). Together with the b-values, these can be the input parameters for a curve adaptation to obtain the diffusion tensor based on Equation 2.

It would also be possible to use other formulas (derived from the Stejkstal-Tanner equation, for example) in Step U1. It should be understood that, instead of Equation 2, other models can also be used, for example models which take multiple diffusion tensors into account etc. Numerous models to describe the diffusion weighting depending on the intensity-corrected MR images are known to the man skilled in the art, such that here no additional details must be cited. In principle, in Step U1 models can be used which establish a relationship between a variable quantifying the diffusion and the measurement values or, respectively, the diffusion gradient fields.

It should be understood that—even if the subsequent data analysis of the diffusion imaging uses more complicated models, for instance multiple diffusion tensors or Kurtosis imaging—Steps U1, U2, U3 can be implemented with the conventional (and comparably simple) diffusion tensor model of Equation 2 in any case.

The determination of the additional intensity correction from the estimated diffusion tensor and the intensity-corrected MR images takes place in Step U2. For example, if Equation 2 is used, a deviation or, respectively, difference between the respective intensity-corrected MR image and the estimated diffusion tensor can result (see also Equation 2a). This deviation can be used as the additional intensity correction and be subtracted from the intensity-corrected MR images in Step U3.

If convergence of the diffusion tensor is established in Step U4 (for example between two iterations of Steps U1-U3, or if maximum iteration number is also achieved), the method ends in Step U5. Otherwise, Steps U1, U2, U3 are implemented again, and in fact with the MR images that are obtained from Step U3.

It should be understood that Steps U1-U3 and U4 are implemented with image point resolution, i.e. for each image point of the MR images.

The embodiments that were described in the preceding with regard to FIG. 6-9 are based on a grouping of the MR images 31 such that the MR result images 32 are determined as trace-weighted or pseudo-trace-weighted MR result images 32, for example via geometric mean calculation of the MR images 31 belonging to a group 70. In the following, with regard to FIG. 9 a further aspect of the invention is illustrated in which in particular no association of the diffusion gradient fields 50 or of the MR images 31 with groups 70 takes place, and MR result images are also not necessarily created. This can have the result that successive MR images 31 can be selected more flexibly, and in particular their sequence does not need to be sorted with regard to the orthogonality criterion or different b-values can be used, for example.

The method begins in Step V1. The acquisition of the MR images 31 with the sequence of diffusion gradient fields 50 takes place in Step V2. As presented in the preceding, in comparison to other embodiments of the present invention the sequence of diffusion gradient fields 50 does not need to satisfy the orthogonality criterion for successively acquired or, respectively, grouped MR images 31. Moreover, it is possible that at least some successive diffusion gradient fields 50 have different b-values in the sequence of diffusion gradient fields 50, meaning that successive diffusion gradient fields 50 have different strengths.

It is also possible that the sequence of the diffusion gradient fields 50 is established or, respectively, sorted such that the orientation of the diffusion gradient fields 50 varies strongly as a function of time, meaning that a spatial derivative of successive diffusion gradient fields 50 assumes a value that is greater than a predetermined change threshold. It is therefore achieved that a time derivative of the intensity 60 that results due to the diffusion weighting of the MR images 31 is greater than a time dependency of the intensity 60 due to heating of the MR components 214, 215. This has been discussed in the preceding with regard to FIG. 5.

While the sequence of the diffusion gradient fields 50 in the embodiment of FIG. 6-9 as one example and the embodiment of FIG. 10 as another, can be established with regard to different criteria (different b-values 51 or orthogonality criterion), at least the feature of the large difference of the orientation of successive diffusion gradient fields 50 can be desirable for both embodiments. Generally stated, it is desirable to obtain the change of the intensity 60 due to different diffusion weighting of the MR images 31 with a strong time dependency (with regard to successively acquired MR images 31), such that the relatively slow time dependency of the intensity 60 due to heating of the MR components 214, 215 can be determined.

For each image point 35 of the MR images 31, the estimation of the diffusion tensor 40 takes place in Step V3 under consideration of the model of the time dependency (see Equation 3) of the intensity 60. For example, the model can be expressed by a series expansion with a polynomial basis (see Equation 4) or trigonometric basis (see Equation 5). Equation 3 can then be used to determine the diffusion tensor 40 and the MR result images 32, for example by means of adaptation or, respectively, fit. The parameter $k_i$ of the model can be determined as well in this fit. Since a defined spatial dependency is expected for $k_1$, this spatial dependency can be considered as, for example, a boundary condition between adjacent image points 35 in the fit.

In general, other models—thus multi-tensor models etc., for example—can be used (instead of Equation 3), for example as presented with regard to FIG. 9.

The intensity correction from the model of the time dependency of the intensity is determined in Step V4, thus also under consideration of the parameters which were determined by fit in Step V3. For example, the model of the time dependency can quantify the contribution to the signal intensity in the MR images (designated as scaling factors, for example) that is caused due to the heating or, respectively, other unwanted effects. Therefore, the intensity correction can be determined directly from the model of the time dependency. In a particularly simple embodiment, the intensity correction corresponds to the value of the model of the time dependency of the intensity that is obtained by curve fitting, for example, and the application of the intensity correction corresponds to the subtraction of this value from the MR images.

Step V5 corresponds to Step T5 of FIG. 8. The method ends in Step V6.

Although the invention has been illustrated and described in detail by the preferred exemplary embodiments, the invention is not limited by the disclosed examples, and other variations can be derived from those skilled in the art without departing from the scope of the invention.

For example, it can be possible for the individual steps of FIG. 6, 8, 9, 10 to be implemented in a different order or at separate times. In particular, the intensity correction 33 and the creation of the MR result images 32 do not need to have a close time correlation with the acquisition of the MR images 31.

While the units in FIG. 1 have been drawn as individual elements, it should be understood that it is possible to combine individual units, for example as hardware and/or software. FIG. 1 illustrates the units with regard to their functionality, and it is possible to realize the functionality of the units by software code or hardware elements of superordinate units. For example, it would be possible to integrate the computer 221 entirely or partially into a system computer of the MR system 230, or even to implement entirely or partially outside of the MR system.

Moreover, it would be possible to use the techniques to determine the diffusion tensor (as they have been described in the preceding with regard to FIGS. 9 and 10, for example) for other purposes than the intensity correction. In general, it is namely possible to determine the diffusion tensor, by means of the techniques according to the invention, from diffusion-weighted MR images that have an intensity contribution from other sources than the diffusion weighting. For example, Steps V4 and V5 of FIG. 10 are optional in this regard. In particular, this can be applicable if a DTI technique is used for subsequent data analysis, in which DTI technique only or predominantly the knowledge of the diffusion tensor is significant but a precise knowledge of the intensity-corrected MR images is unnecessary or of subordinate relevance.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for time-dependent intensity correction of diffusion-weighted magnetic resonance (MR) images, comprising:

operating an MR data acquisition unit to acquire data representing a plurality of diffusion-weighted MR images, with a sequence of diffusion gradient fields having respectively different directions, each of said diffusion-weight MR images being comprised of image points;

entering said plurality of diffusion-weighted MR images on an input into a processor and, in said processor for each image point of each diffusion-weighted MR image, estimating a diffusion tensor based on the MR images and based on a model of a time dependency of intensity;

in said processor, determining an intensity correction based on said model of said time dependency;

in said processor, applying the intensity correction to said MR images to obtain corrected MR images; and making the corrected MR images available at an output of said processor in electronic form, as respective data files.

2. A method as claimed in claim 1 comprising using, as said model of time dependency, a model that is at least partially predetermined, and, from said processor, accessing said at least partially predetermined model.

3. A method as claimed in claim 1 comprising generating said model to embody at least one of a time-dependent heating of gradient coils in said MR data acquisition unit, a polynomial dependency of intensity on time, a trigonometric dependency of intensity on time, and a spatial dependency between different image points.

4. A method as claimed in claim 1 comprising determining said model of time dependency according to a spatial dependency used as boundary condition with respect to adjacent image points.

5. A method as claimed in claim 1 comprising determining said model of time dependency using a polynomial dependency as a series expansion up to a predetermined order.

6. A method as claimed in claim 1 comprising determining said model of time dependency using a trigonometric dependency as a series expansion up to a predetermined order.

7. A method as claimed in claim 1 wherein at least some successive diffusion gradient fields in said sequence have respectively different b-values.

8. A method as claimed in claim 1 wherein a spatial derivative of successive diffusion gradient fields in said sequence assumes a value that is greater than a predetermined change threshold.

9. A method for time-dependent intensity correction of diffusion-weighted magnetic resonance (MR) images, comprising:

operating an MR data acquisition unit to acquire data representing a plurality of diffusion-weighted MR images with a sequence of diffusion gradient fields, respectively activated in different directions;

entering said plurality of diffusion-weighted MR images on an input into a processor and, in said processor, automatically associating diffusion gradient fields among said plurality of different diffusion gradient fields, that have respective directions that satisfy an orthogonality criterion into at least one subset of said plurality of diffusion gradient fields;

in said processor, for each set of diffusion gradient fields, generating an MR result image from respective MR constituent images formed by data acquired with diffusion weighting produced by the diffusion gradient field in each subset, thereby giving said MR result image a suppressed direction dependency of said diffusion weighting in comparison to said MR constituent images;

from the respective MR result images created for each subset, determining an intensity correction in said processor;

in said processor, applying said intensity correction to the constituent MR images to produce intensity-corrected MR images; and making the intensity-corrected MR images available at an output of said processor in electronic form, as respective data files.

10. A method as claimed in claim 9 wherein each of said intensity-corrected MR images is comprised of image points, with each image point having an intensity associated therewith, and wherein said method comprises, for each of said image points of each of said intensity-corrected MR images, iteratively:

estimating a diffusion tensor based on the intensity-corrected MR images;

determining an additional intensity correction from the estimated diffusion tensor and the intensity-corrected MR images;

applying the additional intensity correction to the intensity-corrected MR images; and terminating iteration when a predetermined convergence criterion is satisfied.

11. A method as claimed in claim 10 comprising estimating said diffusion tensor by:

adapting image point values of the diffusion tensor based on image point values of the respective image points of the intensity-corrected MR image, and based on b-values of the diffusion gradient fields.

12. A method as claimed in claim 9 comprising creating the MR result image from the constituent MR images in a respective subset by calculating a geometric mean of said constituent MR images in the respective group.

13. A method as claimed in claim 9 comprising associating said different diffusion gradient fields into respective subsets according to at least one further criterion selected from the group of criteria consisting of:

a predetermined number of successive diffusion gradient fields;

no diffusion gradient field is commonly associated with successive subsets;

no more than one diffusion gradient field is commonly associated with successive subsets;

no more than two diffusion gradient fields are commonly associated with successive subsets;

diffusion gradient fields associated with a same subset exhibit respectively different directions having an angle, with respect to 90°, that is less than a predetermined angle threshold; or diffusion gradient fields associated with a same subset have same b-values.

14. A method as claimed in claim 13 wherein said predetermined number is 3.

15. A method as claimed in claim 9 wherein said constituent MR images and said MR result image are each comprised of image points, and comprising intensity-correcting said constituent MR images by, for each image point thereof:

determining a temporal scaling of the intensity from the MR result images; and applying the intensity correction to each image point by normalizing the intensity of the MR images to a reference intensity value based on said determined temporal scaling.

16. A method as claimed in claim 9 comprising determining said intensity correction by at least one of:
low-pass filtering a spatial frequency domain representation of the MR result images;
suppressing background noise in the MR result images; and
for different image points in said MR result imaging, determining a fraction of an intensity value with respect to a reference intensity value of that image point, as the intensity correction.

17. A magnetic resonance (MR) apparatus for time-dependent intensity correction of diffusion-weighted MR images, comprising:
an MR data acquisition unit;
a control computer configured to operate the MR data acquisition unit to acquire data representing a plurality of diffusion-weighted MR images with a sequence of diffusion gradient fields, respectively activated in different directions;
a processor that receives said plurality of diffusion-weighted MR images and that is configured to associate diffusion gradient fields among said plurality of different diffusion gradient fields, that have respective directions that satisfy an orthogonality criterion into at least one subset of said plurality of diffusion gradient fields;
said processor being configured, for each subset of diffusion gradient fields, to generate an MR result image from respective MR constituent images formed by data acquired with diffusion weighting produced by the diffusion gradient field in that respective subset, thereby giving said MR result image a suppressed direction dependency of said diffusion weighting in comparison to said MR constituent images;
said processor being configured to determine, from the respective MR result images created for each subset, an intensity correction;
said processor being configured to apply said intensity correction to the constituent MR images to produce intensity-corrected MR images; and
said processor being configured to make the intensity-corrected MR images available at an output of said processor in electronic form, as respective data files.

18. A magnetic resonance (MR) apparatus for time-dependent intensity correction of diffusion-weighted MR images, comprising:
an MR data acquisition unit;
a control computer configured to operate the MR data acquisition unit to acquire data representing a plurality of diffusion-weighted MR images, with a sequence of diffusion gradient fields having respectively different directions, each of said diffusion-weight MR images being comprised of image points;
a processor configured to estimate, for each image point of each diffusion-weighted MR image, a diffusion tensor based on the MR images and based on a model of a time dependency of intensity;
said processor being configured to determine an intensity correction based on said model of said time dependency;
said processor being configured to apply the intensity correction to said MR images to obtain corrected MR images; and
said processor being configured to make the corrected MR images available at an output of said processor in electronic form, as respective data files.

* * * * *